United States Patent
Ferguson

(10) Patent No.: US 10,250,032 B2
(45) Date of Patent: Apr. 2, 2019

(54) INTELLIGENT POWER STRIP WITH MANAGEMENT OF BISTABLE RELAYS TO REDUCE CURRENT IN-RUSH

(71) Applicant: Liebert Corporation, Columbus, OH (US)

(72) Inventor: Kevin R. Ferguson, Dublin, OH (US)

(73) Assignee: Vertiv Corporation, Columbus, OH (US)

( * ) Notice: Subject to any disclaimer, the term of this patent is extended or adjusted under 35 U.S.C. 154(b) by 173 days.

(21) Appl. No.: 15/095,576

(22) Filed: Apr. 11, 2016

(65) Prior Publication Data

US 2016/0315465 A1    Oct. 27, 2016

Related U.S. Application Data

(60) Provisional application No. 62/152,126, filed on Apr. 24, 2015.

(51) Int. Cl.
  *H01R 13/70* (2006.01)
  *H02H 9/02* (2006.01)
  (Continued)

(52) U.S. Cl.
  CPC ............ *H02H 9/02* (2013.01); *H01R 13/70* (2013.01); *H02H 1/043* (2013.01); *H02H 3/06* (2013.01);
  (Continued)

(58) Field of Classification Search
  USPC ......................................................... 307/31
  See application file for complete search history.

(56) References Cited

U.S. PATENT DOCUMENTS

| 4,626,698 A | 12/1986 | Harnden, Jr. et al. |
| 4,864,157 A | 9/1989 | Dickey |

(Continued)

FOREIGN PATENT DOCUMENTS

| CN | 103155327 A | 6/2013 |
| CN | 103683221 A | 3/2014 |
| WO | 1999000811 A1 | 1/1999 |

OTHER PUBLICATIONS

International Search Report and Written Opinion of the International Search Authority for corresponding International Application No. PCT/US2016/027088, dated Jul. 1, 2016, 11 pages.

(Continued)

*Primary Examiner* — Rexford Barnie
*Assistant Examiner* — Xuan Ly
(74) *Attorney, Agent, or Firm* — Harness, Dickey & Pierce, P.L.C.

(57) ABSTRACT

The present disclosure relates to a power distribution unit (PDU) having at least one power receptacle for enabling attachment of an AC power cord of an external device thereto. A branch receptacle controller (BRC) has at least one bistable relay and is associated with the one power receptacle for supplying AC power thereto from an AC power source. The BRC monitors a parameter of a line voltage and uses it to detect when AC power is lost, and then toggles the bistable relay, if the relay is in a closed position, to an open position. A rack power distribution unit controller (RPDUC) monitors the bistable relay and commands the BRC to close the bistable relay after AC power is restored.

21 Claims, 4 Drawing Sheets

(51) Int. Cl.
*H02J 3/00* (2006.01)
*H05K 7/14* (2006.01)
*H02H 1/04* (2006.01)
*H02H 3/06* (2006.01)
*H02H 3/08* (2006.01)
*H02H 3/46* (2006.01)
*H04Q 9/00* (2006.01)

(52) U.S. Cl.
CPC ............. *H02H 3/08* (2013.01); *H02H 3/46* (2013.01); *H02J 3/00* (2013.01); *H04Q 9/00* (2013.01); *H05K 7/1492* (2013.01); *H04Q 2209/60* (2013.01)

(56) References Cited

U.S. PATENT DOCUMENTS

| | | | |
|---|---|---|---|
| 5,267,120 A | 11/1993 | Graff et al. | |
| 5,361,184 A | 11/1994 | El-Sharkawi et al. | |
| 5,533,360 A | 7/1996 | Szynal et al. | |
| 5,804,991 A | 9/1998 | Hu | |
| 5,821,642 A | 10/1998 | Nishhira et al. | |
| 5,838,077 A | 11/1998 | Chelcun et al. | |
| 6,232,675 B1 | 5/2001 | Small | |
| 6,233,132 B1 | 5/2001 | Jenski | |
| 6,768,615 B2 | 7/2004 | Liu | |
| 6,903,554 B2 | 6/2005 | Wilson et al. | |
| 7,227,732 B2 | 6/2007 | Wang | |
| 7,795,759 B2 | 9/2010 | DuBose et al. | |
| 7,957,117 B2 | 6/2011 | Divan | |
| 8,154,841 B2 | 4/2012 | Allen et al. | |
| 8,305,737 B2 | 11/2012 | Ewing et al. | |
| 8,519,745 B2 | 8/2013 | Scholder | |
| 8,559,154 B2 | 10/2013 | Li et al. | |
| 8,639,459 B1 | 1/2014 | Morales et al. | |
| 8,675,325 B2 | 3/2014 | Beierschmitt et al. | |
| 8,737,030 B2 | 5/2014 | Valdes | |
| 9,122,466 B1 | 9/2015 | Kellett et al. | |
| 2007/0291430 A1 | 12/2007 | Spitaels et al. | |
| 2011/0072289 A1 | 3/2011 | Kato | |
| 2011/0102052 A1* | 5/2011 | Billingsley | H01H 9/542 327/365 |
| 2013/0258538 A1 | 10/2013 | Billingsley et al. | |
| 2013/0286528 A1 | 10/2013 | Murfett et al. | |
| 2014/0218008 A1* | 8/2014 | Ewing | H04Q 9/00 324/76.11 |
| 2014/0268474 A1 | 9/2014 | Steiner et al. | |
| 2015/0012145 A1 | 1/2015 | Kiko | |
| 2015/0055272 A1 | 2/2015 | Creighton et al. | |
| 2016/0315465 A1 | 10/2016 | Ferguson | |
| 2016/0327595 A1 | 11/2016 | Reinders et al. | |

OTHER PUBLICATIONS

First Office Action and Search Report for corresponding Chinese Patent Application No. 201680023607.9 issued by the China National Intellectual Property Administration dated Sep. 5, 2018, 15 pp.

\* cited by examiner

INTELLIGENT POWER STRIP WITH MANAGEMENT OF BISTABLE RELAYS TO REDUCE CURRENT IN-RUSH

CROSS-REFERENCE TO RELATED APPLICATION

This application claims the benefit of U.S. Provisional Application No. 62/152,126 filed on Apr. 24, 2015. The entire disclosure of the above application is incorporated herein by reference.

FIELD

The present disclosure relates to intelligent power strips with bistable relays, and more particularly to an intelligent power strip which is able to control a plurality of bistable relays in a manner to limit in-rush current as external devices being powered by the intelligent power strip are turned on.

BACKGROUND

This section provides background information related to the present disclosure which is not necessarily prior art.

Certain models of intelligent power strips use power relays, typically rated less than 250V 20 Arms, to switch a line of a receptacle for the main purpose of rebooting a connected load device, e.g., server. Depending upon the load device's internal power supply design, substantial in-rush currents may occur while its input bulk capacitors charge up the moment the relay contacts are closed. This brief, but large current surge, can permanently damage the relay contacts, i.e., weld them close, so they are no longer operative. It can also cause the upstream circuit protection device, typically a circuit breaker, to trip. Some relay manufacturers offer more expensive devices that can handle momentary current surges up to four times their design rating. To further supplement the protection of the relay contacts, the in-rush currents can be mitigated by coordinated timing of relay closure according to the voltage zero-crossing of line frequency.

A number of power strips commonly referred to as Rack PDUs, have switching capabilities associated with all receptacles. PDU stands for power distribution unit and a Rack PDU is used in racks that hold electronic equipment such as servers. The primary reason for the switching capabilities has been two-fold: (a) To be able to remotely recycle power to a connected equipment that is hung up; and (b) To be able to sequentially start up all connected equipment to ensure that upstream breakers do not trip due to all connected loads drawing high in-rush currents concurrently. Typical IT (information technology) loads, for example servers, can draw as much as 5 times their normal current at the time of startup. The above capabilities have typically been addressed in the past through the use of solid state relays at each receptacle.

Bistable relays are increasingly being used in Rack PDU's as they are more energy efficient since their coils do not need to remain energized to maintain the state of their contacts. In such a bistable relay, the coil is pulsed to change the state of the contacts from open to closed and vice-versa. The contacts will then remain in their existing state until the coil is pulsed again. In contrast, in a typical normally open relay, when it is desired to close the contacts of the relay, the coil of the relay must be energized and kept energized to keep the contacts closed. When the coil of the typical normally open relay is de-energized, the relay contacts revert to their normally open state. Similarly, in a typical normally closed relay, when it is desired to open the contacts of the relay, the coil of the relay must be energized and kept energized to keep the contacts open. When the coil of typical normally closed relay is de-energized, the relay contacts revert to their normally closed state. In Rack PDU's having bistable relays, the bistable relays that are closed when there is a loss of power will remain closed. When power is restored, the cumulative in-rush current through the closed bistable relays may cause the upstream circuit protection device, typically a circuit breaker, to trip.

SUMMARY

In one aspect the present disclosure relates to a power distribution unit (PDU) comprising at least one power receptacle configured to enable attachment of an alternating current (AC) power cord of an external device to the power receptacle. A branch receptacle controller (BRC) may also be included which has at least one bistable relay and which is associated with the at least one power receptacle for supplying AC power to the at least one power receptacle from an external AC power source. The bistable relay has contacts able to be set to an open position and to a closed position. The BRC may further be configured for monitoring a parameter of a line voltage from the external AC power source, and to use the monitored parameter to detect when a loss of AC power occurs, and to toggle the bistable relay, if the bistable relay is in a closed position, to an open position upon the detection of an AC power loss condition. A rack power distribution unit controller (RPDUC) may be included which is configured to communicate with the BRC and to monitor a state of the bistable relay, and to command the BRC to selectively close the bistable relay after AC power is restored.

In another aspect the present disclosure relates to a power distribution unit (PDU) which may comprise at least one power receptacle configured to enable attachment of an alternating current (AC) power cord of an external device to the power receptacle. A branch receptacle controller (BRC) may be included which has a plurality of bistable relays and which is associated with the at least one power receptacle, for supplying AC power to the at least one power receptacle from an external AC power source. Each of the bistable relays may have contacts able to be set to an open position and to a closed position. The BRC may further be configured for monitoring a frequency of a line voltage from the external AC power source, and to use the monitored frequency to detect when a loss of AC power occurs, and to toggle any one or more of the bistable relays which is a closed position to an open position upon the detection of an AC power loss condition. The BRC may further detect a loss of AC power condition by monitoring the frequency of the line voltage and determining, from information relating to a zero crossing of the monitored frequency, that an AC power loss condition has occurred. A rack power distribution unit controller (RPDUC) may also be included which is configured to communicate with the BRC and to control the bistable relays such that the relays that were previously in a closed position prior to the AC power loss condition are all sequentially commanded to again be closed after the AC Power is restored, in a manner that limits an in-rush of current to the PDU.

In still another aspect the present disclosure relates to a method for monitoring and controlling an application of AC power to a plurality of data center devices. The method may comprise providing at least one AC power receptacle forming a power attachment point for an alternating current (AC)

power cord of an independent data center device. The method may also comprise using a branch receptacle controller (BRC) having at least one bistable relay associated with the power receptacle for supplying AC power to the AC power receptacle from an external AC power source, the bistable relay having contacts which are able to be set to an open position and to a closed position. The BRC may be used to monitor a parameter associated with a line voltage of the external AC power source. The monitored parameter may be used to detect when a loss of AC power is about to occur. In response to a detected imminent loss of AC power, the BRC may be used to toggle the bistable relay, if the bistable relay is currently in a closed position immediately before power is lost, to an open position, before power to the BRC is lost. A rack power distribution unit controller (RPDUC) may be used which is configured to communicate with the BRC and to monitor a state of the bistable relay, and to command the BRC to close the bistable relay after AC power is restored.

DRAWINGS

The drawings described herein are for illustrative purposes only of selected embodiments and not all possible implementations, and are not intended to limit the scope of the present disclosure.

Corresponding reference designations indicate corresponding parts throughout the several views of the drawings.

DETAILED DESCRIPTION

Example embodiments will now be described more fully with reference to the accompanying drawings.

In accordance with an aspect of the present disclosure, bistable relays of an intelligent power distribution strip are managed so that in-rush current is minimized upon restoration of power after a power loss. Since the relays are bistable relays, their last state is persistent regardless of power condition. Upon loss of power, the bistable relays are controlled so that all closed bistable relays are automatically opened. Loss of power can be due to loss of source AC power from an upstream power utility, failure of an uninterruptible power supply ("UPS") upstream of the intelligent power distribution strip that provides power to the intelligent power distribution strip, or a circuit breaker tripping due to overcurrent conditions. Upon the next power up cycle, the bistable relays that are to be closed are closed sequentially with each one of such bistable relays being closed per every N line cycles to minimize overall in-rush current and prevent the upstream circuit breaker from tripping. The line frequency is monitored and detection of loss of line frequency indicates imminent power loss resulting in the bistable relays being opened. Each bistable relay that is to be closed during the next power up cycle is closed during the power up cycle at a minimum voltage (zero voltage crossing) point of line frequency to minimize contact arcing and in-rush current through its relay contacts. The bistable relays may be opened at a minimum current (zero current crossing) point of line frequency to minimize contact arcing.

Figure 1:
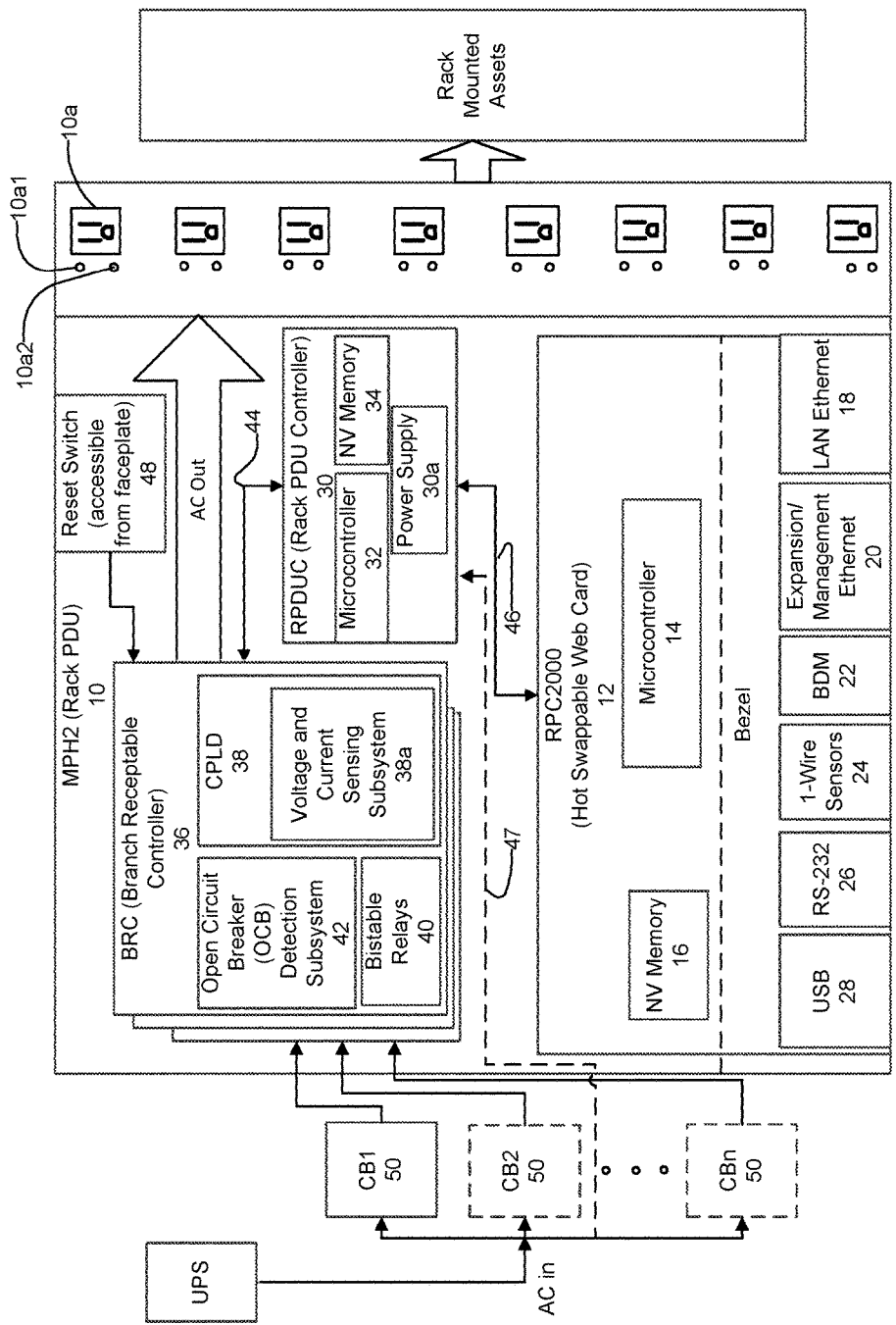
FIG. 1 is a block diagram of one embodiment of a PDU in accordance with the present disclosure for monitoring and controlling AC power applied to each one of a plurality of AC power receptacles of the PDU.

With reference to FIG. 1 of the drawings, an illustrative Rack PDU in accordance with the present disclosure is described. In the following description, MPH2 10 represents the Rack PDU, and will hereinafter simply be referred to as "MPH 10". A RPC2000 12 (hereinafter simply "RPC 12") in this example may be a hot-swappable web card which is installed in the MPH 10. The RPC 12 may include a microcontroller 14 and preferably also a non-volatile (NV) memory 16. The RPC 12 may also include a plurality of ports including, but not limited to, a LAN Ethernet port 18, an Expansion/Management port 20, a port 22 for coupling to a display module (e.g., "BDM" or "Basic Display Module" available from the assignee of the present disclosure), one or more 1-wire sensor ports 24, an RD-232 port 26 and a USB port 28. The MPH 10 further includes a Rack PDU Controller (RPDUC) 30 having a microcontroller 32 and a non-volatile memory 34, and one or more branch receptacle controllers (BRC) 36. Each BRC 36 may have a complex programmable logic device (CPLD) 38 having a voltage and current sensing subsystem 38a which senses of a loss of AC input power, a plurality of bistable relays 40, and an open circuit breaker (OCB) detection subsystem 42 which senses for an open circuit breaker condition. The RPDUC 30 is in bidirectional communication with each of the BRCs 36 via a bus 44. The RPC 12 is in bidirectional communication with the RPDUC 30 via a bus 46. A reset switch 48, which is easily accessible by a user via a faceplate of the MPH 10, is provided for enabling the user to initiate a hard reset to the BRCs 36 of the system 10A.

FIG. 1 also shows a plurality of branch circuit breakers (CB) 50. By "branch" circuit breaker it is meant that each of the CBs 50 are uniquely associated with one specific BRC 36. The OCB detection subsystem 42 monitors the CBs 50 to detect when any one or more have been tripped to an open condition. And as explained above, each BRC 36 includes a plurality of bistable relays 40, which in one specific embodiment comprise eight (8) bistable relays. However, it will be appreciated that a greater or lesser number of bistable relays 40 could be provided per branch. Mechanical bistable relays have coils and mechanical contacts. They can be single coil or dual coil relays. Also, more than one CB 50 may exist for each BRC 36. For example, each BRC 36 can have its bistable relays arranged in two sub banks, with a separate CB 50 associated with each sub-bank. As used herein, each sub-bank of a BRC 36 is a branch of the BRC.

FIG. 1 also shows a plurality of AC power receptacles 10a each having a first associated optical element 10a1 and a second optical element 10a2. Optical elements 10a1 may each be an LED having a first color, for example green, that indicates a status of the specific bistable relay 40 associated with its specific AC receptacle 10a. The second group of optical elements 10a2 may also be, for example, LEDs having a different color, for example red, for providing additional information to the user. Each one of the green LEDs 10a1 may indicate, for example, that the bistable relay 40 associated with that specific AC receptacle 10a is closed, and an extinguished green LED 10a1 would therefore indicate that the associated bistable relay is open. Input power to the MPH 10 may be from an uninterruptible power supply (UPS) or from any other AC power source.

Figure 2:
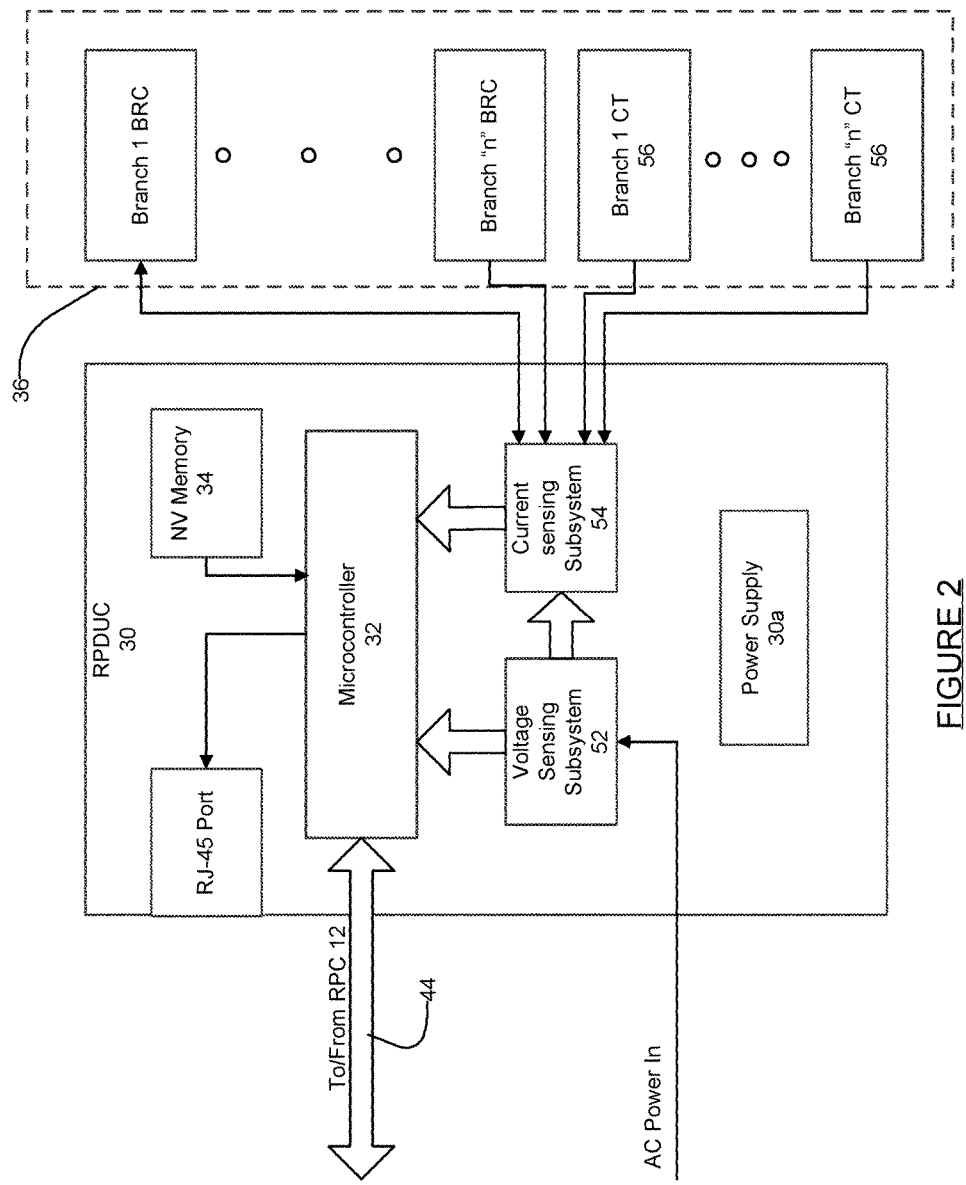
FIG. 2 is a high level block diagram of the RPDUC in accordance with one embodiment of the present disclosure.

The RPDUC 30 is shown in greater detail in FIG. 2. The RPDUC 30 includes a voltage sensing subsystem 52 and a current sensing subsystem 54. The subsystems 52 and 54 perform real time RMS voltage measurements and RMS current measurements, respectively, and thus monitor the power input from the AC power source. The monitored power information may be shared with the RPC 12 via bus 44. As noted above, the voltage and current sensing subsystem 43 of each BRC 36 also monitors for a loss of AC input power, so in this regard there is redundancy of this feature in the RPDUC 30 and the BRCs 36. The current sensing subsystem 54 of the RPDUC 30 receives an input current signal from each of the branch BRCs (collectively labeled for simplicity in FIG. 2 with number 36) which it uses to perform its current sensing function. Each branch BRC 36 also includes a plurality of current transformers (CTs) 56 for independently measuring a current being drawn by the AC receptacles 10a associated with each branch of bistable relays 40. The signals from each branch CT 56 are input to the current sensing subsystem 54 for analysis.

The RPC 12 shown in FIG. 1 manages, monitors and reports information about MPH 10 energy metering and power distribution status obtained from the RPDUC 30 to networked software clients. The RPDUC 30 provides support for the energy metering measurements and calculations, control management, and communications interfaces to the RPC 12, as described above. The RPDUC 30 communicates with each BRC 36 and, except upon power loss, controls the bistable relays 40 of each BRC by sending command messages to each BRC to independently control each one of its associated bistable relays 40.

The BRC 36, and more particularly its CPLD 38, directly controls its bistable relays 40. The BRC 36 also senses individual LED receptacle operational status, and loss of an AC input power signal via line frequency monitoring performed by the voltage and current detection subsystem 38a, as well as using the OCB subsystem 42 to detect for an open circuit breaker condition. The bistable relays 40 of each BRC 36 in this example require a nominal 16 msec pulse to their coils to change states, that is, to open or close their contacts. A reference herein to a bistable relay being "open" means that its contacts are open and power is off or interrupted at the receptacle 10a to which the bistable relay switches power. As used herein, "power up", "power down", "power failure", and "power cycle" refer to specific conditions of input AC line voltage, which is the AC power provided to the receptacles 10a through the bistable relays 40 of each BRC 36. The term "Configured state", when used in connection with the bistable relays 40, means the state that a given bistable relay is configured to be in (i.e., open or closed) when power is on.

The RPC 12 commands the RPDUC 14 via a SMBus (I2C) communication bus, bus 46 in FIG. 1 in this example, which in turn, commands the BRC 36 via a SPI communication bus, which is bus 44 in this example, to configure the relay state of each bistable relay 40. The RPDUC 30 is capable of autonomous behavior without RPC 12 commands. The one or more BRCs 36 are each capable of autonomous behavior without RPDUC 30 commands.

Figure 3:
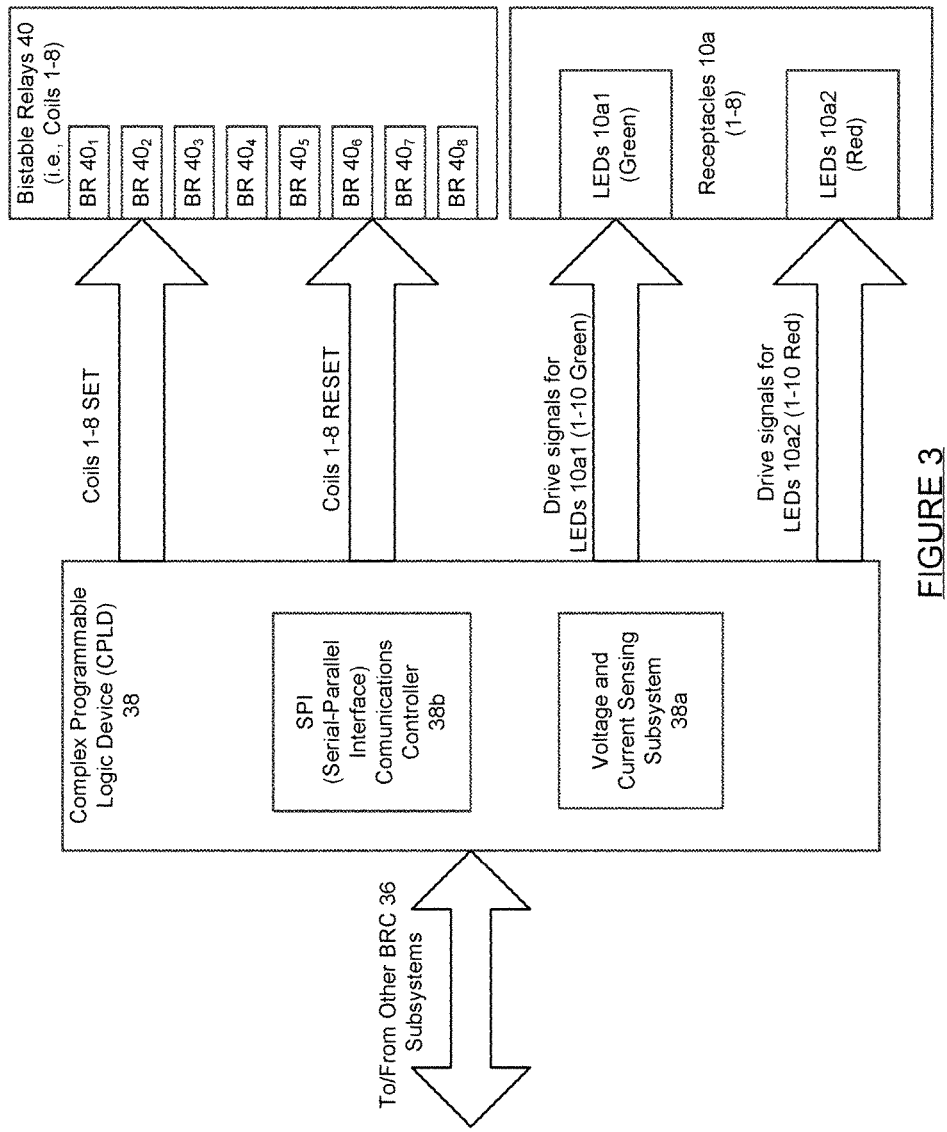
FIG. 3 is a block diagram of one embodiment of the CPLD used in the BRC.

Referring to FIG. 3, the CPLD 38 of one of the BRCs 36 is shown in greater detail. In this example eight bistable relays 40₁-40₈ are shown, but it will be appreciated that the MPH 10 may control a greater or lesser number of bistable relays 40. The CPLD 38 includes a serial-parallel interface ("SPI") controller 38b that manages communications with other subsystems of the CPLD. The CPLD 38 includes suitable logic for generating signals to independently command the bistable relays 40 to each assume a first state ("SET" signals) or a second state ("RESET" signals). The CPLD 38 also includes logic for controlling the green LEDs 10a1 and the red LEDs 10a2. The CPLD may control the green LEDs 10a1 so that the green LEDs 10a1 flash at a first rate when a given bank of bistable relays 40 is drawing a current which is close to an upper predetermined current limit. The CPLD 38 may control the green LEDs 10a1 so that the green LEDs 10a1 flash at a second rate different from the first rate (e.g., faster rate) when an overcurrent condition arises (i.e., a given bank of bistable relays 40 is drawing more current than allowed). The CPLD 38 may control the red LEDs 10a2 so that all of the red LEDs 10a2 stay illuminated continuously if an over-current condition arises where a given bank of bistable relays 40 is drawing more current than allowed. The red LEDs 10a2 may also be controlled to flash or pulse if an open circuit board condition arises.

Figure 4:
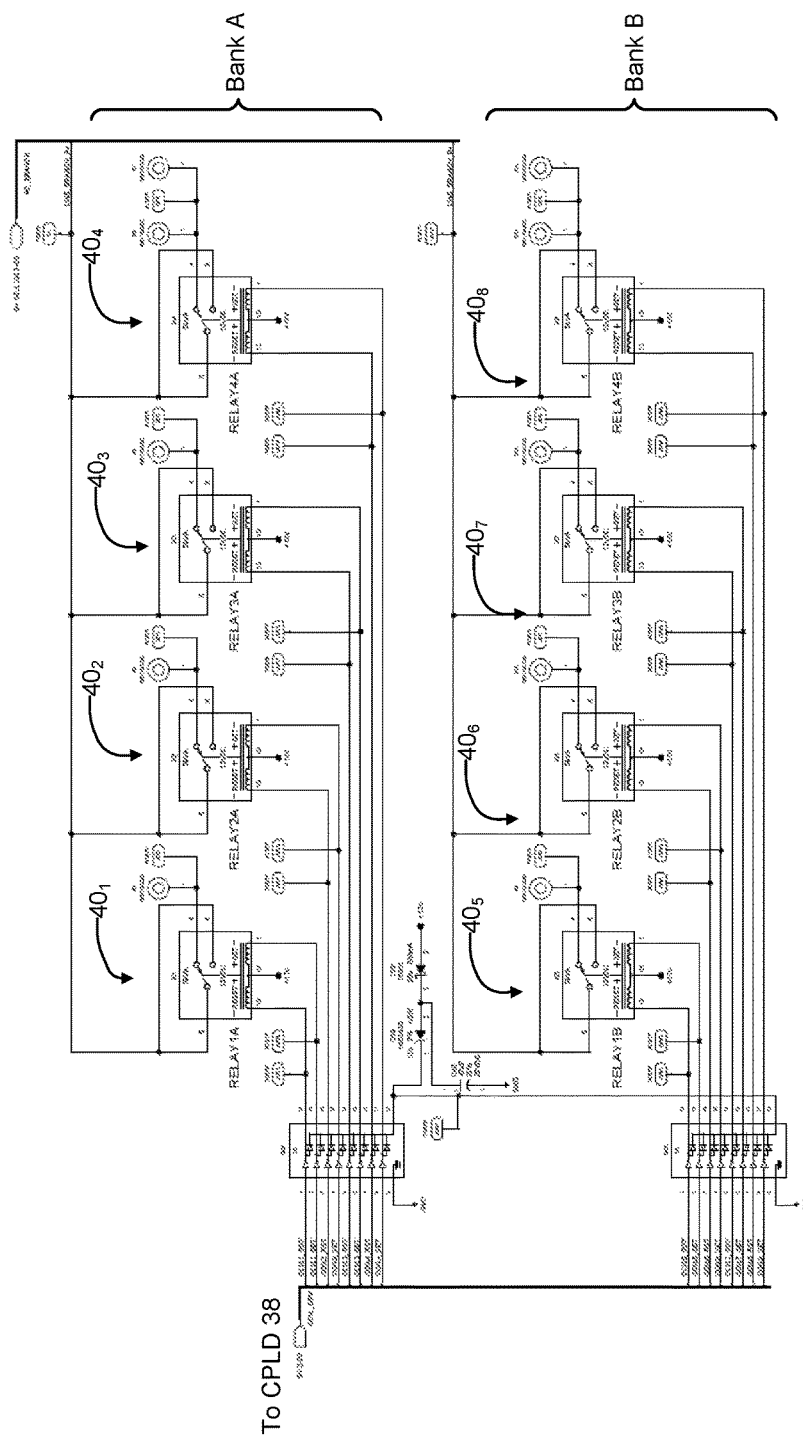
FIG. 4 illustrates eight (8) bistable relays arranged in two sub banks (i.e., sub bank A and sub bank B).

In the BRCs 36, the voltage and current sensing subsystem 38a of each CPLD 38 monitor loss of line frequency on load sides of the respective CB 50 for each of the BRCs 36. Each BRC 36 allows for two sub-banks of power distribution and the AC power feed can be either same or differently phased. Each sub-bank of bistable relays 40 may optionally have its own CPLD 38 and OCB subsystem 42. FIG. 4 illustrates eight (8) bistable relays 40₁-40₈ arranged in two sub banks (i.e., sub bank A and sub bank B).

Each of the one or more BRCs 36 infers imminent power loss by detecting a loss of line frequency of the AC line signal from the AC power source. Each BRC 36 monitors the line frequency and sets true loss of line frequency status after a short period during which less than the expected number of detected voltage zero crossing transitions of the AC line signal has occurred. A true loss of line frequency is defined to be when less than three (3) zero voltage transitions or zero crossings occur over a 32.768 ms interval, satisfying both 50/60 Hz operation. The zero crossing detection hardware of the BRC 36 has built-in hysteresis and digitizes the line frequency. The digitized line frequency is provided to the BRC 36 that uses digital filtering for reliable triggering. In this regard, the BRC 36 counts zero-crossing voltage transitions to make this determination. The number of transitions allows for a single worst case % cycle delay for zero crossing.

The detection period for detecting loss of line frequency must be small so that the relay coil voltage of each bistable relay 40, derived from the power supply 30a which is powering the entire system 10 (i.e., the RPDUC 30, the BRC 36 and the RPC 12), is maintained sufficiently long enough (typically about 16 ms) for the BRC 36 to pulse the bistable relays 40 that need to be opened into the open state. At a worst case fully loaded condition, i.e., powered at 70 Vac and RPC 12 fully operational, there is approximately 64 ms of power supply hold time.

The RPDUC 30 has a similar capability to monitor the loss of line frequency on a line side of the CB 50, as indicated by dashed line 47 in FIG. 1. For monitoring redundancy, its loss of line frequency status may be commanded or indicated by dedicated signals via the SPI communication bus 44 going to each BRC 36, so that each BRC 36 may monitor and compare its own loss of line status, to the status being reported by the RPDUC 30, before any action is taken by the BRC 36. Also, the RPDUC 14 may assert a dedicated signal going to the RPC 12 to cause it to enter a low power operating mode in order to extend the power supply hold time.

The BRC 36 CPLD 38 doesn't distinguish between power loss due to loss of line power or due to CB 50 open conditions. Therefore, upon power loss, the BRC 36 controls all the bistable relays 40 in the affected sub-bank so that their contacts are switched to (or left in) the open condition. That is, upon power loss, the BRC 36 opens the bistable relays 40 that are closed and leaves open the bistable relays that are open.

A commanded receptacle 10*a* state overrides autonomous power-up state behavior. That is, if during a power-up cycle a power-up delay for a receptacle 10*a* is pending due to the sequencing of closing the bistable relays 40 that are to be closed, a separate command to power on a receptacle results in immediate processing closure of the bistable relay 40 for that receptacle.

At initial system startup, all CBs 50 are manually tripped by a user to the open state before power is applied. This results in the RPDUC 30, upon power-up, autonomously commanding the BRCs 36 to control all the bistable relays 40 to be open immediately to mitigate in-rush currents. Afterwards, the RPDUC 30 queries each BRC 36 to confirm that all of its bistable relays 40 are open and, if they are, alerts a user that the CBs 50 for that BRC 36 may then be closed. The LED 10*a*1 associated with each receptacle 10*a* is on (illuminated) when the bistable relay 40 for that receptacle is then closed, and is off when the bistable relay for that receptacle is open. Although the bistable relays 40 would typically be set to the default "open" position at manufacturing time, the occurrence of excessive shock or vibration during transportation and/or installation may cause a change in state.

If for the same BRC 36 one CB 50 is detected to be closed at line power loss (true loss of line frequency), all bistable relays 40 are set to their configured receptacle 10*a* power up state by the RPDUC 30. That is, the bistable relays 40 that are in a closed state at line power loss are set to be re-closed upon power up, and the bistable relays that are in an open state are set to remain open upon power up.

If for the same BRC 36, both CBs 50 are detected open at line power loss (true loss of line frequency), all the bistable relays 40 are controlled by the RPDUC 30 so that all of these bistable relays 40 remain open at power up until the CBs 50 are closed. Upon the CBs 50 being closed, the RPDUC 30 proceeds as discussed above during initial system start up. Then upon confirming that all the bistable relays 40 of a BRC 36 are open, the RPDUC 30 then proceeds to command the BRC to close the bistable relays 40 that are to be closed, which the RPDUC may do sequentially as discussed below.

If the power supply of the RPDUC 30 fails, the RPDUC and the BRCs 36 no longer operate; however, the bistable relays 40 remain in their last configured states, even during subsequent power cycle(s). In this aspect, the power supply of the RPDUC 30 provides power to the BRC 36.

The current bistable relay 40 states are immediately updated in the volatile register memory (not shown) of the BRC 36 when configured by the RPDUC 30 and/or when autonomously changed by the BRC 36, and the volatile register memory can be read by the RPDUC 30 from each BRC 36. The RPDUC 30 then updates the states for those bistable relays 22 stored in non-volatile memory 34 of the RPDUC.

Except in the event of a power loss where all the closed bistable relays of each affected sub bank of each affected BRC 36 are opened, only a single bistable relay state per branch of a BRC is permitted to change per N line cycles to mitigate in-rush currents and prevent the CB 50 associated with that particular branch from unexpectedly opening or tripping. For example, during a power up cycle of an affected branch of a BRC 36, the RPDUC 30 determines which bistable relays 40 of that affected branch are to be closed. It then sequentially sends commands to the BRC 36 to close those bistable relays 40, one command for a different bistable relay every N line cycles. That is, the RPDUC 30 sends the BRC 36 a command to close one of the bistable relays 40 that are to be closed every N line cycles. This results in one such bistable relay 40 being closed every N line cycles. It should be understood that the non-volatile memory 34 of the RPDUC 30 is used by the RPDUC to store the real time configured states of all the bistable relays 40 of all the BRCs 36. The RPDUC 30 then determines which bistable relays of an affected branch of an affected BRC 36 are to be closed during a power-up cycle based on the stored configured states.

The RPDUC 30 may have an all-digital phase-locked loop implemented in firmware. The RPDUC 30 may operate to lock onto the line frequency and precisely coordinate analog-to-digital conversion processes for voltage and current measurements, and to send commands to the BRCs 36 in a deterministic fashion prior to voltage zero-crossing of line frequency. The RPDUC 30 may also command each BRC 36 to close its associated bistable relays 40 according to a synchronized timing to a minimum voltage, which will be at the zero cross of line frequency, to mitigate in-rush current. The RPDUC 30 may synchronize to both line-neutral and line-line voltages. The RPDUC 30 commands each BRC 36 to open its associated bistable relays 40 according to synchronized timing to minimum current zero crossing of line frequency to minimize contact arcing.

The open and close timings of the bistable relays 40 may be measured during manufacturing functional testing and saved to non-volatile memory, such as the non-volatile memory 34 of the RPDUC 30. It should be understood that the BRC 36 may have non-volatile memory as well, and that these timings could alternatively or additionally be saved to the non-volatile memory of the BRC and retrieved by the RPDUC 30 as needed. It will also be understood that the bistable relays 40 have an inherent delayed response until release/open states are achieved because of the coils' operate/release times. These timing values are used by the RPDUC 30 to compensate the command execution timing to better synchronize the actual open/close states according to arrival of the voltage and current zero crossing states. For example, if a particular bistable relay 40 was measured to have a 9 msec close time, when the RPDUC 30 is sending a command to the BRC 36 having that bistable relay 40, to cause it to close, the RPDUC does so 9 msec before the next zero voltage line crossing point.

The RPDUC 30 may also compensate for relay contact bounce by commanding the closure state ~1 msec earlier so that a typical 1-2 msec contact bounce occurs around line voltage zero-crossing point. In the foregoing example of the bistable relay 40 having a 9 msec closure time, the RPDUC 14 then sends the command to the BRC 36 to close the bistable relay 10 msec in advance of the next line voltage zero-crossing point.

The RPC 12 may also report an abnormal operating condition when a bistable relay 40 is commanded to be opened but current is still measured flowing through it. As shown in FIG. 2, each receptacle 10*a* has one of the current transformers 56 associated with it that is used to measure current being drawn by the receptacle. This abnormal condition may result from failed or stuck closed relay contacts. The BRC 36 communicates the currents being measured by its current transformers 56 to the RPDUC 30 which then determines whether such an abnormal operating condition exists. If one does exist, the RPDUC 30 communicates this to the RPC 12.

As shown in the drawings, each of the RPC 12, RPDUC 30 and the BRC 36 include the CPLD 38, the microcontroller 32 and the microcontroller 14, respectively, which each include appropriate logic for implementing the above described logic functions. It should be understood that other types of devices can be used such as a digital processor (DSP), microprocessor, microcontroller, Field Programmable Gate Array (FPGA), or application specific integrated circuit (ASIC). When it is stated that RPC 12, RPDUC 30 or BRC 36 have logic for a function, it should be understood that such logic can include hardware, software, or a combination thereof, including the logic implemented in the CPLD.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A power distribution unit (PDU) comprising:
   at least one power receptacle configured to enable attachment of an alternating current (AC) power cord of an external device to the power receptacle;
   a branch receptacle controller (BRC) having at least one bistable relay and associated with the at least one power receptacle for supplying AC power to the at least one power receptacle from an external AC power source, the bistable relay having contacts able to be set to an open position and to a closed position;
   the BRC further configured to monitor a parameter of a line voltage from the external AC power source, and to use the monitored parameter to detect when a loss of AC power is about to occur, and to toggle the bistable relay, when the bistable relay is in a closed position, to an open position upon the detection that AC power is about to be lost; and
   a rack power distribution unit controller (RPDUC) configured to communicate with the BRC and to monitor a state of the bistable relay, and to command the BRC to close the bistable relay after AC power is restored.

2. The PDU of claim 1, further comprising a rack programmable controller (RPC) configured to monitor energy metering and power distribution status information concerning the PDU, and to communicate the information to at least one external subsystem to provide.

3. The PDU of claim 1, wherein the BRC includes a plurality of bistable relays, and wherein the RPDUC operates to sequentially close selected ones of the plurality of bistable relays that had been closed just prior the loss of AC power, and which had been opened by the BRC upon detection that the AC power was about to be lost, in a manner that limits an in-rush of current to the PDU.

4. The PDU of claim 1, wherein the BRC includes an open circuit breaker detection subsystem for detecting when a circuit breaker associated with the bistable relay has opened.

5. The PDU of claim 1, wherein the monitoring of the parameter of the line voltage includes monitoring a frequency of the line voltage by the BRC, and using the BRC to detect when the AC power is about to be lost by monitoring a zero crossing of a line voltage of the AC power being supplied to the PDU.

6. The PDU of claim 5, wherein the BRC detects that the AC power is about to be lost by detecting when less than three zero voltage crossings transitions occur over a predetermined time interval.

7. The PDU of claim 6, wherein the predetermined time interval is about 32.768 ms.

8. The PDU of claim 1, wherein the RPDUC is configured to also monitor for a loss of AC power by monitoring zero crossings of the voltage of the AC power being supplied, and to communicate information to the BRC when the RPDUC detects a loss of the AC Power.

9. The PDU of claim 1, wherein the RPDUC includes a non-volatile memory for storing a present condition of the bistable relay.

10. The PDU of claim 9, wherein the RPDUC reads the non-volatile memory to determine the state of the bistable relay for the purpose of determining when the bistable relay needs to be re-closed after AC power is restored to the PDU following the loss of the AC power loss.

11. The PDU of claim 1, wherein BRC includes a plurality of bistable relays, and wherein the plurality of bistable relays is arranged in at least two sub banks.

12. The PDU of claim 11, wherein each one of the sub banks is operatively associated with a separate circuit breaker.

13. A power distribution unit (PDU) comprising:
    at least one power receptacle configured to enable attachment of an alternating current (AC) power cord of an external device to the power receptacle;
    a branch receptacle controller (BRC) having a plurality of bistable relays and associated with the at least one power receptacle for supplying AC power to the at least one power receptacle from an external AC power source, each of the bistable relays having contacts able to be set to an open position and to a closed position;
    the BRC further configured for monitoring a zero crossing of a line voltage from the external AC power source, and to use the monitored zero crossing to detect when a full loss of AC power is about to occur, and to toggle any one or more of the bistable relays which is a closed position to an open position upon the detection that the full loss of AC power is about to occur, but before the full loss of AC power occurs; and
    a rack power distribution unit controller (RPDUC) configured to communicate with the BRC and to control the bistable relays such that the relays that were previously in a closed position prior to the full loss of AC power are all sequentially commanded to again be closed after the AC Power is restored, to limit an in-rush of current to the PDU.

14. The PDU of claim 13, further comprising a rack programmable controller (RPC) configured to monitor energy metering and power distribution status information concerning the PDU, and to communicate the information to at least one external subsystem to provide.

15. The PDU of claim 13, wherein the RPDUC monitors a state of each of the bistable relays, and commands the BRC to selectively close specific ones of the bistable relays after AC power is restored in a manner that implements a predetermined time delay between successive closings of the bistable relays.

16. The PDU of claim 13, wherein the BRC further comprises an open circuit breaker detection subsystem to detect when a circuit breaker associated with the bistable relays has opened.

17. The PDU of claim 13, wherein the BRC detects when the full loss of AC power is about to occur by detecting when less than three zero voltage crossings transitions occur for an AC voltage waveform of the AC power over a predetermined time interval.

18. The PDU of claim 13, wherein the BRC includes a non-volatile memory for storing a present condition of each one of the bistable relays.

19. The PDU of claim 18, further comprising a rack programmable controller (RPC) configured to monitor energy metering and power distribution status information concerning the PDU, and to communicate the information to at least one external subsystem to provide; and wherein the RPC monitors a present condition of each one of the bistable relays by accessing the non-volatile memory.

20. The PDU of claim 13, further comprising a plurality of optical elements, each one of said plurality of optical elements being uniquely associated with one of the bistable relays to provide an optical indication of a status of its associated said bistable relay, and wherein the status indicates whether the associated said bistable relay is presently in an open position or a closed position.

21. A method for monitoring and controlling an application of AC power to a plurality of data center devices, the method comprising:

providing at least one AC power receptacle forming a power attachment point for an alternating current (AC) power cord of an independent data center device;

using a branch receptacle controller (BRC) having at least one bistable relay associated with the power receptacle for supplying AC power to the AC power receptacle from an external AC power source, the bistable relay having contacts which are able to be set to an open position and to a closed position;

using the BRC to monitor a parameter associated with a line voltage of the external AC power source, and to use the monitored parameter to detect when a full AC power loss condition is about to occur;

in response to detecting that a full AC power loss condition is about to occur, using the BRC to toggle the bistable relay, when the bistable relay is currently in a closed position immediately before the full AC power is lost, to an open position, and before the full AC power to the BRC is lost; and using a rack power distribution unit controller (RPDUC) configured to communicate with the BRC and to monitor a state of the bistable relay, and to command the BRC to close the bistable relay after AC power is restored.

\* \* \* \* \*